(12) United States Patent
Park et al.

(10) Patent No.: US 8,847,215 B2
(45) Date of Patent: Sep. 30, 2014

(54) ORGANIC LIGHT-EMITTING DIODE AND METHOD OF FABRICATING THE SAME

(71) Applicant: LG Display Co., Ltd., Seoul (KR)

(72) Inventors: Jin-Ho Park, Gyeonggi-do (KR); Kwang-Hyun Kim, Daegu-si (KR); Min-Na Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/723,920

(22) Filed: Dec. 21, 2012

(65) Prior Publication Data

US 2014/0054556 A1    Feb. 27, 2014

(30) Foreign Application Priority Data

Aug. 24, 2012   (KR) .................. 10-2012-0092979

(51) Int. Cl.
*H01L 51/50*    (2006.01)

(52) U.S. Cl.
CPC .......... *H01L 51/504* (2013.01); *H01L 51/5064* (2013.01)
USPC ............. 257/40; 257/89; 257/642; 257/759; 313/503; 313/504; 438/29; 438/69; 438/82

(58) Field of Classification Search
USPC ............................................ 257/89, 642–643
See application file for complete search history.

(56) References Cited

U.S. PATENT DOCUMENTS

| 2005/0142976 | A1* | 6/2005 | Suzuki | ............................ 445/24 |
| 2005/0186330 | A1* | 8/2005 | Kim et al. | ....................... 427/66 |
| 2005/0280355 | A1* | 12/2005 | Lee et al. | ..................... 313/503 |
| 2011/0297977 | A1* | 12/2011 | Kajimoto | ........................ 257/89 |
| 2012/0286300 | A1* | 11/2012 | Kijima | ............................ 257/88 |

FOREIGN PATENT DOCUMENTS

KR   10-2005-0082644     8/2005

* cited by examiner

*Primary Examiner* — Wael Fahmy
*Assistant Examiner* — Quinton Brasfield
(74) *Attorney, Agent, or Firm* — Morgan, Lewis & Bockius LLP

(57) ABSTRACT

An organic light-emitting diode includes an anode on a substrate; a first hole transporting layer on the anode; a second hole transporting layer on the first hole transporting layer and corresponding to the red and green pixel areas; a first emitting material pattern of a first thickness on the second hole transporting layer and corresponding to the red pixel area; a second emitting material pattern of a second thickness on the second hole transporting layer and corresponding to the green pixel area; a third emitting material pattern of a third thickness on the first hole transporting layer and corresponding to the blue pixel area; an electron transporting layer on the first, second and third emitting material patterns; and a cathode on the electron transporting layer, wherein the second thickness is less than the first thickness and greater than the third thickness.

10 Claims, 5 Drawing Sheets

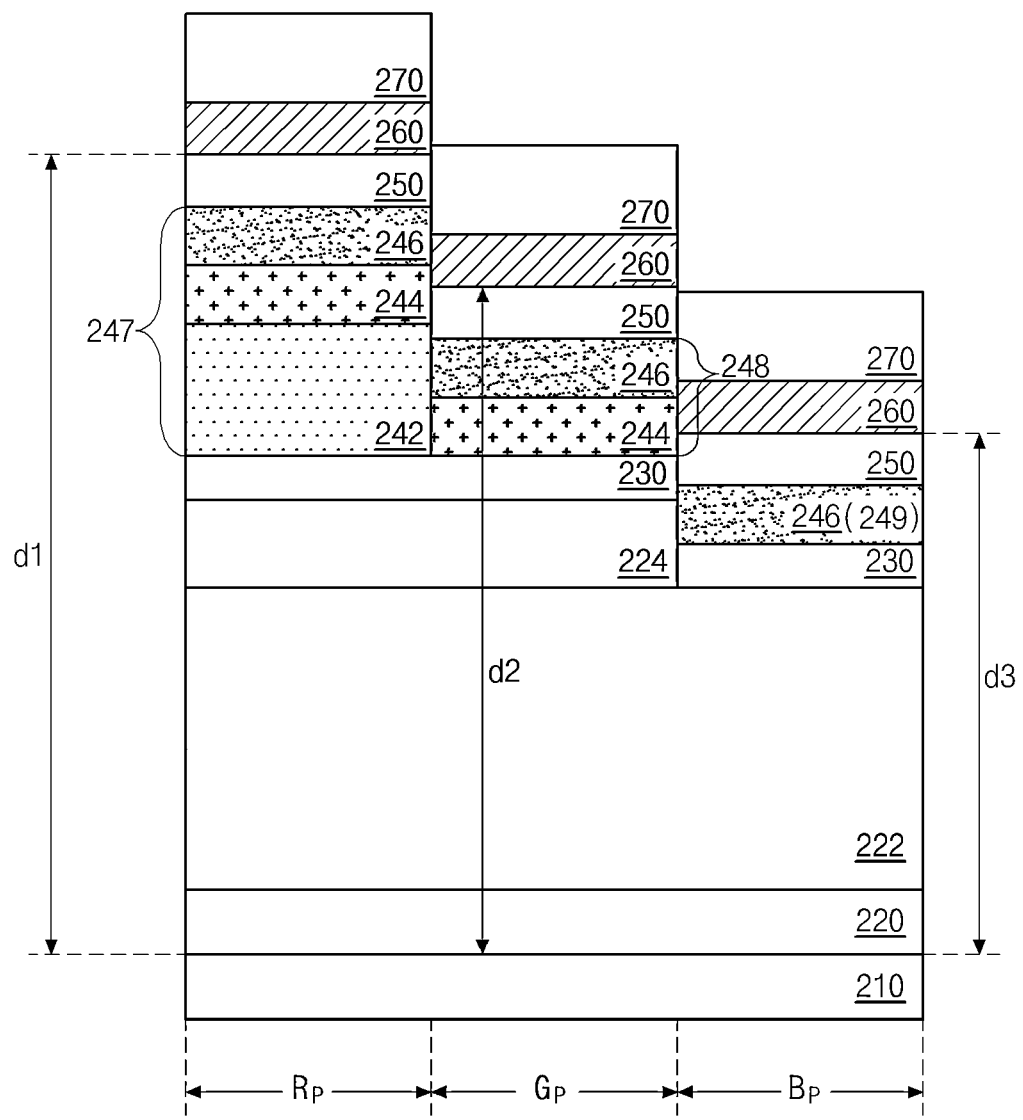

US 8,847,215 B2

ORGANIC LIGHT-EMITTING DIODE AND METHOD OF FABRICATING THE SAME

The present application claims the priority benefit of Korean Patent Application No. 10-2012-0092979 filed in Republic of Korea on Aug. 24, 2012, which is hereby incorporated by reference.

BACKGROUND

1. Field of the Disclosure

The present disclosure relates to an organic light-emitting diode, and more particularly, to an organic light-emitting diode capable of reducing the number of masks required in a fabrication process to thereby reduce a fabricating cost and simplify the fabrication process, and a method of fabricating the organic light-emitting diode.

2. Discussion of the Related Art

A cathode ray tube (CRT) has been used as a display for various electronics for a long time. However, recently, flat panel display devices, such as a plasma display panel (PDP), a liquid crystal display (LCD), and an organic light-emitting diode (OLED) display device, have been developed and widely used.

Among the above-mentioned flat panel display devices, the organic light-emitting diode display device can be fabricated as a lightweight, slim display since it is a self-luminous device requiring no backlight.

Also, the organic light-emitting diode display device has low consumption power, allows direct-current low-voltage driving, has a high response speed, is highly resistant to external impacts since the internal element is solid, and also has a wide operating temperature range.

Particularly, since the organic light-emitting diode display device can be fabricated with a simple fabrication process, it can be fabricated with a lower fabrication cost than a liquid crystal display device.

FIG. 1 is a circuit diagram showing the structure of a pixel of a conventional active matrix type organic light-emitting diode display device.

Referring to FIG. 1, a pixel of the active matrix type organic light-emitting diode display device includes a switching thin film transistor STr, a driving thin film transistor DTr, a storage capacitor StgC, and an organic light-emitting diode E.

Also, gate lines GL are formed in a first direction, data lines DL are formed in a second direction crossing the first direction, and a power line PL for supplying a voltage is formed to be spaced apart from a data line DL.

The switching thin film transistor STr is formed at a crossing of a data line DL and a gate line GL, and electrically connected to the driving thin film transistor DTr.

The driving thin film transistor DTr is electrically connected to the organic light-emitting diode E. That is, a first electrode of the organic light-emitting diode E corresponding to one terminal of the organic light-emitting diode E is connected to the drain electrode of the drain thin film transistor DTr, and a second electrode of the organic light-emitting diode E corresponding to the other terminal of the organic light-emitting diode E is connected to the ground. The power line PL transfers a supply voltage to the organic light-emitting diode E. Also, the storage capacitor StgC is formed between the gate electrode and source electrode of the driving thin film transistor DTr.

Accordingly, if a signal is applied through the gate line GL, the switching thin film transistor STr is turned on, a signal of the data line DL is transferred to the gate electrode of the driving thin film transistor DTr to turn on the driving thin film transistor DTr, so that light is emitted through the organic light-emitting diode E. If the driving thin film transistor DTr is turned on, a level of current flowing from the power line PL to the organic light-emitting diode E is decided so that the organic light-emitting diode E can implement a gray scale. Also, the storage capacitor StgC acts to maintain the gate voltage of the driving thin film transistor DTr constant when the switching thin film transistor STr is turned off, to thereby maintain the level of the current flowing through the organic thin film diode E constant until a next frame even when the switching thin film transistor STr is turned off.

As shown in FIG. 2, the organic light emitting diode E includes an anode 10 on which red, green, and blue pixel areas Rp, Gp, and Bp are defined, a hole transporting layer 12, an emitting material layer consisting of a red organic light-emitting pattern 14, a green organic light-emitting pattern 16, and a blue organic light-emitting pattern 18, an electron transporting layer 20, and a cathode 22. Although not shown in FIG. 2, a hole injection layer may be disposed between the anode 10 and the hole transporting layer 12, and an electron injection layer may be disposed between the cathode 22 and the electron transporting layer 20

In the organic light-emitting diode E, if voltages are applied to the anode 10 and the cathode 22, holes and electrons are transferred to the emitting material layer, and coupled with each other in the emitting material layer to thereby emit light. However, the conventional organic light-emitting diode has limitations in light output efficiency and color properties.

SUMMARY OF THE INVENTION

Accordingly, the present invention is directed to an organic light-emitting diode display device that substantially obviates one or more of the problems due to limitations and disadvantages of the related art.

An object of the present disclosure is to provide an organic light-emitting diode display device with improved light output efficiency and color properties.

Another object of the present disclosure is to provide a method of fabricating an organic light-emitting diode display device, capable of improving light output efficiency without an additional mask process for preventing a fabrication cost from increasing and a fabrication process from being complicated.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, there is provided an organic light-emitting diode including: a substrate on which a red pixel area, a green pixel area, and a blue pixel area are defined; an anode disposed on the substrate and corresponding to the red pixel area, the green pixel area, and the blue pixel area; a first hole transporting layer disposed on the anode and corresponding to the red pixel area, the green pixel area, and the blue pixel area; a second hole transporting layer disposed on the first hole transporting layer and corresponding to the red pixel area and the green pixel area, the second hole transporting layer having a uniform thickness; a first emitting material pattern disposed on the second hole transporting layer and corresponding to the red pixel area, the first emitting material pattern having a first thickness; a second emitting material pattern disposed on the second hole transporting layer and corresponding to the green pixel area, the second emitting material pattern having a second thickness; a third emitting material pattern disposed on the first hole transporting layer and corresponding to the blue pixel area, the third emitting material pattern having a third thickness; an electron transporting layer disposed on the first emitting material pattern, the second emitting material pattern, and the third emitting material pattern and corresponding to the red pixel area, the green pixel area, and the blue pixel area; and a cathode disposed on the electron transporting layer and corresponding to the red pixel area, the green pixel area, and the blue pixel area, wherein the second thickness is less than the first thickness and greater than the third thickness.

In another aspect, there is provided a method of fabricating an organic light-emitting diode, including: forming an anode on the entire surface of a substrate on which a red pixel area, a green pixel area, and a blue pixel area are defined; forming a first hole transporting layer on the anode and corresponding to the red pixel area, the green pixel area, and the blue pixel area; forming a second hole transporting layer on the first hole transporting layer and corresponding to the red pixel area and the green pixel area, the second hole transporting layer having a uniform thickness; forming a red organic light-emitting pattern on the second hole transporting layer and corresponding to the red pixel area; forming a green organic light-emitting pattern on the red organic light-emitting pattern and the second hole transporting layer; forming a blue organic light-emitting pattern on the green organic light-emitting pattern and the first hole transporting layer; forming an electron transporting layer on the blue organic light-emitting pattern; and forming a cathode on the electron transporting layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 4 is a cross-sectional view of an organic light-emitting diode according to a second embodiment of the present invention;

DETAILED DESCRIPTION OF THE PREFERRED EMBODIMENTS

Reference will now be made in detail to the preferred embodiments, examples of which are illustrated in the accompanying drawings.

Figure 1:
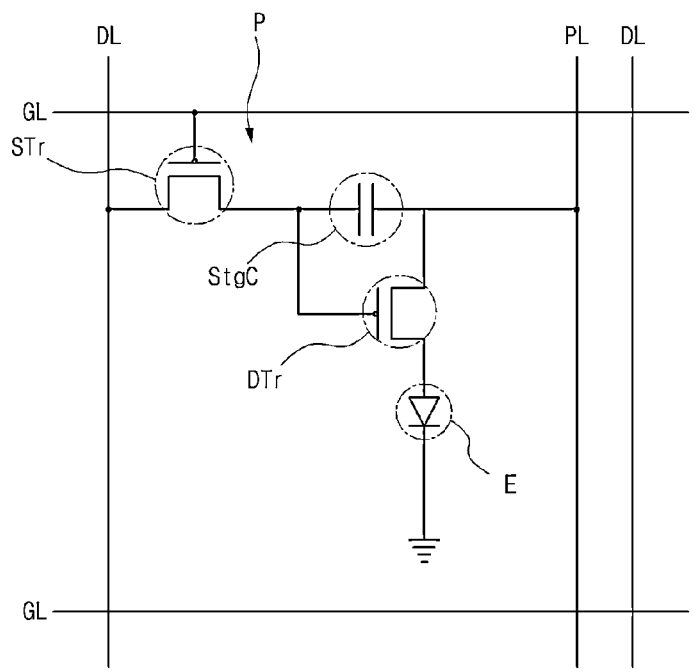
FIG. 1 is a circuit diagram showing the structure of a pixel of a conventional active matrix type organic light-emitting diode display device.
Figure 2:
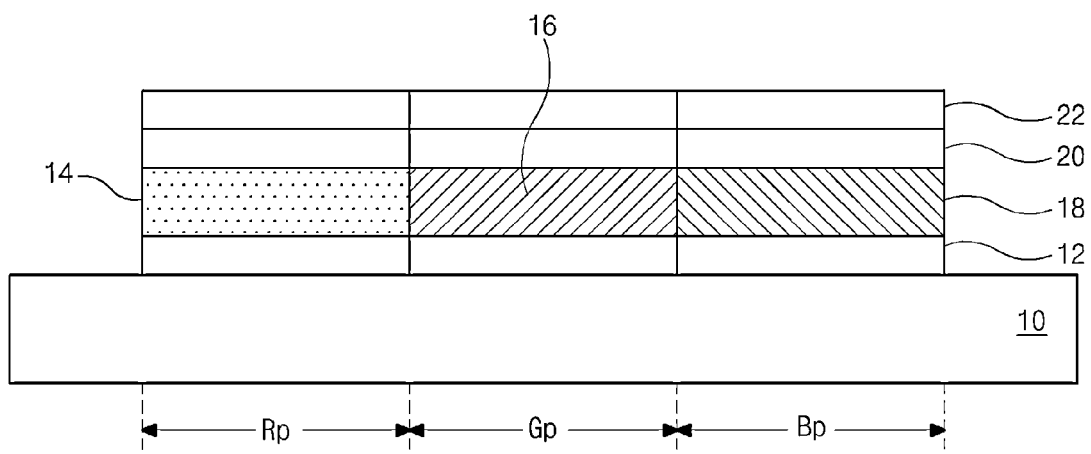
FIG. 2 is a cross-sectional view of a conventional organic light-emitting diode.
Figure 3:
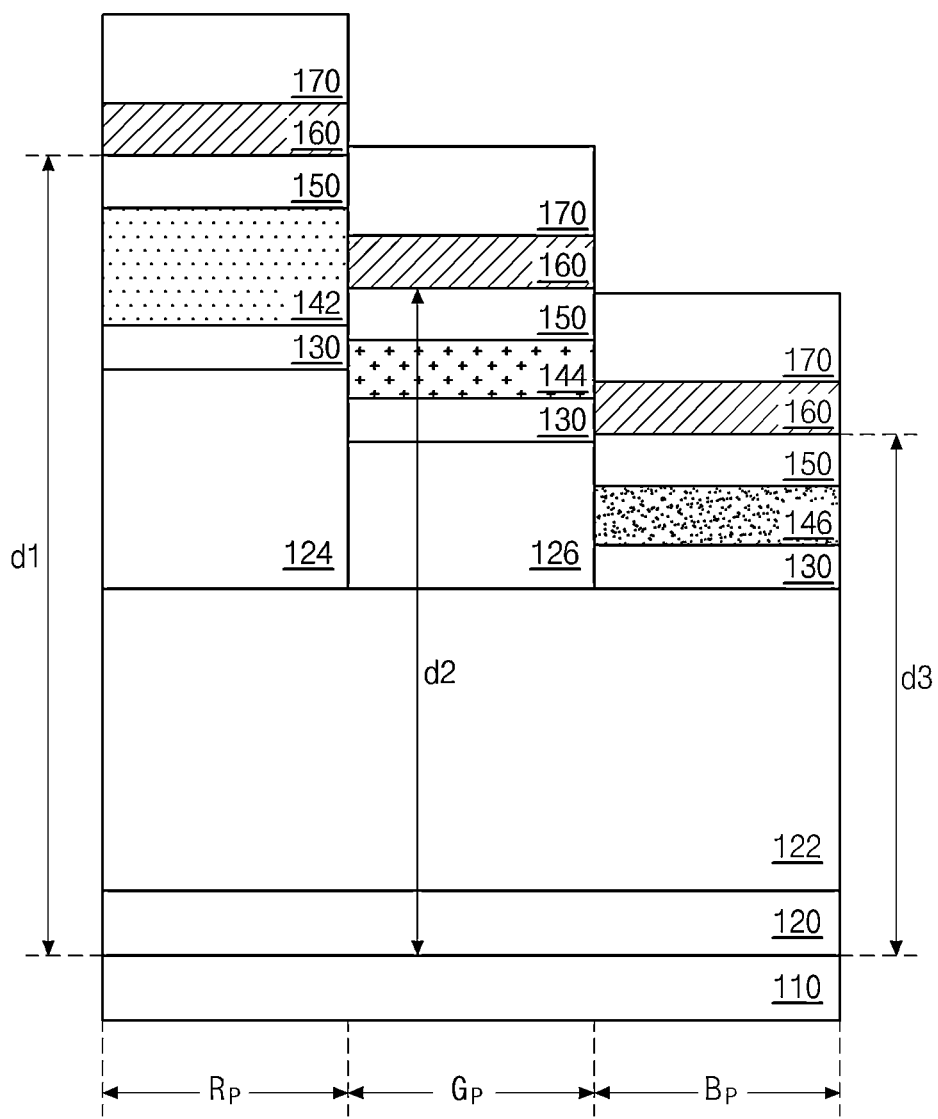
FIG. 3 is a cross-sectional view of an organic light-emitting diode according to a first embodiment of the present invention.

FIG. 3 is a cross-sectional view of an organic light-emitting diode according to a first embodiment of the present invention.

As shown in FIG. 3, the organic light-emitting diode includes an anode 110 applied on a substrate (not shown) on which red, green, and blue pixel areas Rp, Gp, and Bp are defined, a hole injection layer 120, a first hole transporting layer 122, a second hole transporting layer 124, a third hole transporting layer 126, an electron blocking layer 130, an emitting material layer consisting of a red organic light-emitting pattern 142, a green organic light-emitting pattern 144, and a blue organic light-emitting pattern 146, an electron transporting layer 150, a cathode 160, and a capping layer 170.

Also, although not shown in FIG. 3, in an organic light-emitting diode display device including the organic light-emitting diode, a power line is disposed to extend parallel to one of gate lines and data lines that cross each other on the substrate to define the pixel areas Rp, Gp, and Bp, and each of the pixel areas Rp, Gp, and Bp includes a switching thin film transistor connected to a gate line and a data line, and a driving thin film transistor connected to the switching thin film transistor. The driving thin film transistor is connected to the anode 110.

The hole injection layer 120, the first hole transporting layer 122, the second hole transporting layer 124, the third hole transporting layer 126, the electron blocking layer 130, the red organic light-emitting pattern 142, the green organic light-emitting pattern 144, the blue organic light-emitting pattern 146, and the electron transporting layer 150 configure an organic light-emitting layer.

The anode 110 is formed in the shape of a plate in the red, green, and blue pixel areas Rp, Gp, and Bp, and the other components are independently formed in the respective red, green, and blue pixel areas Rp, Gp, and Bp. The anode 110 is a reflective electrode, and may include a transparent, conductive material layer formed of a material having a high work function, such as indium-tin-oxide (ITO), and a reflective material layer formed of a material such as Ag or an Ag alloy.

The hole injection layer 120 and the first hole transporting layer 122 are disposed on the anode 110, in correspondence to all the red, green, and blue pixel areas Rp, Gp, and Bp. The first hole transporting layer 122 is a common hole transporting layer, and the hole injection layer 120 may be omitted. The total thickness of the hole injection layer 120 and the first hole transporting layer 122 may be about 1250 Å, but may be adjusted in consideration of the characteristics of hole injection and hole transportation.

The second and third hole transporting layers 124 and 126 are disposed on the first hole transporting layer 122, in correspondence to the red and green pixel areas Rp and Gp. The second hole transporting layer 124 is thicker than the third hole transporting layer 126. The second hole transporting layer 124 may have a thickness of about 750 Å, and the third hole transporting layer 126 may have a thickness of about 500 Å. However, the thicknesses of the second and third hole transporting layers 124 and 126 may be adjusted as long as the second hole transporting layer 124 is thicker than the third hole transporting layer 126.

The electron blocking layer 130 is disposed on the second and third hole transporting layers 124 and 126 and the first hole transporting layer 122 corresponding to the blue pixel area Bp. The electron blocking layer 130 causes electrons emitted from the cathode 160 to stay in the emitting material layer. The electron blocking layer 130 may be omitted.

The red organic light-emitting pattern 142, the green organic light-emitting pattern 144, and the blue organic light-emitting pattern 146 are positioned in correspondence to the red, green, and blue pixel areas Rp, Gp, and Bp, respectively, and the red organic light-emitting pattern 142 is thicker than the green and blue organic light-emitting patterns 144 and 146. The red organic light-emitting pattern 142 has a thickness of about 400 Å, and each of the green and blue organic light-emitting patterns 144 and 146 has a thickness of about 200 Å. However, the thicknesses of the red, green, and blue organic light-emitting patterns 142, 144, and 146 may be adjusted as long as the red organic light-emitting pattern 142 is thicker than the green and blue organic light-emitting patterns 144 and 146.

The electron transporting layers 150 are disposed on the red, green, and blue organic light-emitting patterns 142, 144, and 146. Each electron transporting layer 150 has a thickness of about 350 Å, however, the thickness of the electron transporting layer 150 may be adjusted in consideration of the characteristics of electron transportation. The electron transporting layer 150 may function as an electron transporting and injection layer, and an electron injection layer may be formed on the electron transporting layer 150.

The cathode 160 is positioned on the electron transporting layer 150. For example, the cathode 160 is formed of an alloy (Mg:Ag) of magnesium (Mg) and silver (Ag) to have a semi-transparent property. That is, light emitted from the emitting material layer is displayed to the outside through the cathode 160, and a part of the light returns to the anode 110 since the cathode 160 has the semi-transparent property.

As such, repeated reflection occurs between the anode 110 acting as a reflective layer and the cathode 160, which is called a microcavity effect. That is, since light is repeatedly reflected in the cavity between the anode 110 and the cathode 160, light efficiency increases.

At this time, since light emitted from the respective red, green, and blue organic light-emitting patterns 142, 144, and 146 has different wavelengths, the thickness of a cavity defined as the distance between the anode 110 and the cathode 160 is differentiated. That is, in the red pixel area Rp from which red light having a longest wavelength is emitted, the anode 110 and the cathode 160 are spaced a first distance d1 apart, in the blue pixel area Bp from which blue light having a shortest wavelength is emitted, the anode 110 and the cathode 160 are spaced a third distance d3 apart, and in the green pixel area Gp from which green light is emitted, a second distance d2 between the anode 110 and the cathode 160 is shorter than the first distance d1 and longer than the third distance d3 (d1>d2>d3).

Accordingly, the first hole transporting layer 122 is formed on the entire surface of the red, green, and blue pixel areas Rp, Gp, and Bp, the second hole transporting layer 124 is additionally formed on the red pixel area Rp, and the third hole transporting layer 126 that is thinner than the second hole transporting layer 124 is formed on the green pixel area GP.

Meanwhile, the capping layer 170 is used to enhance a light extraction effect, and may be formed of one among materials for forming the first, second, third hole transporting layers 122, 124, and 126, materials for forming the electron transporting layer 150, and host materials for forming the red, green, and blue organic light-emitting patterns 142, 144, and 146. However, the capping layer 170 may be omitted.

As such, the organic light-emitting diode having the microcavity structure has improved light emitting efficiency and color properties, however, each of the pixel areas Rp, Gp, and Bp requires an additional mask process to differentiate the thickness of cavity.

In order to differentiate the thickness of cavity between the pixel areas Rp, Gp, and Bp, there is a method of forming the red organic light-emitting material pattern 142 with a very thick thickness. However, a light-emitting material pattern that is too thick causes deterioration of emitting efficiency, which negates the effect of the microcavity structure.

Accordingly, by making the second hole transporting layer 124 formed in the red pixel area Rp thicker than the third hole transporting layer 126 formed in the green pixel area Gp, no separate hole transporting layer is formed in the blue pixel area Bp.

Meanwhile, fine metal masks having openings in correspondence to the pixel areas Rp, Bp, and B are used to form material patterns in the respective pixel areas Rp, Bp, and Gp. Accordingly, in order to form the second and third hole transporting layers 124 and 126 having different thicknesses, it is necessary to perform processes using fine metal masks in different chambers.

Referring again to FIG. 3, after the anode 110 is formed, the hole injection layer 120 and the first hole transporting layer 122 are formed using a first fine metal mask. The hole injection layer 120 is formed by doping a material for forming the first hole transporting layer 122 with a p-type dopant, for example, boron, and the hole injection layer 120 and the first hole transporting layer 122 may be formed using the first fine metal mask in a first chamber.

Then, in a second chamber, the second hole transporting layer 124 is formed in the red pixel area RP using a second fine metal mask, and in a third chamber, the third hole transporting layer 126 is formed in the green pixel area Gp using a third fine metal mask.

Successively, in a fourth chamber, the electron blocking layer 130 is formed in the red, green, and blue pixel areas Rp, Gp, and Bp using a fourth fine metal mask, and in fifth, sixth, and seventh chambers, the red, green, and blue organic light-emitting patterns 142, 144, and 146 are formed using fifth, sixth, and seventh fine metal masks.

Thereafter, in eighth, ninth, and tenth chambers, the electron transporting layer 150, the cathode 160, and the capping layer 170 are sequentially formed using eighth, ninth, and tenth fine metal masks.

That is, in order to implement the microcavity structure, processes have to be performed using 10 fine metal masks in a total of 10 chambers, which leads to an increase of a fabrication cost, and complexity of a fabrication method.

Hereinafter, an organic light-emitting diode capable of overcoming this problem will be described with reference to FIG. 4, which is a cross-sectional view of an organic light-emitting diode according to a second embodiment of the present invention.

As shown in FIG. 4, the organic light-emitting diode includes an anode 210, a hole injection layer 220, a first hole transporting layer 222, a second hole transporting layer 224, an electron blocking layer 230, an emitting material layer consisting of a red organic light-emitting pattern 242, a green organic light-emitting pattern 244, and a blue organic light-emitting pattern 246, an electron transporting layer 250, a cathode 260, and a capping layer 270 stacked on a substrate (not shown) on which red, green, and blue pixel areas Rp, Gp, and Bp are defined.

Although not shown in FIG. 4, in an organic light-emitting diode display device including the organic light-emitting diode, a power line is disposed to extend parallel to one of gate lines and data lines that cross each other on the substrate to define the pixel areas Rp, Gp, and Bp, and each of the pixel areas Rp, Gp, and Bp includes a switching thin film transistor connected to a gate line and a data line, and a driving thin film transistor connected to the switching thin film transistor. The driving thin film transistor is connected to the anode 210.

The hole injection layer 220, the first hole transporting layer 222, the second hole transporting layer 224, the electron blocking layer 230, the red organic light-emitting pattern 242, the green organic light-emitting pattern 244, the blue organic light-emitting pattern 246, and the electron transporting layer 250 configure an organic light-emitting layer. That is, the organic light-emitting diode includes the anode 210 and the cathode 260 that face each other, and the organic light-emitting layer interposed between the anode 210 and the cathode 260.

The anode 210 is formed in the shape of a plate in the red, green, and blue pixel areas Rp, Gp, and Bp, and the other components are independently formed on the respective red, green, and blue pixel areas Rp, Gp, and Bp. The anode 210 is a reflective electrode, and may include a transparent, conductive material layer formed of a material having a high work function, such as indium-tin-oxide (ITO), and a reflective material layer formed of a material, such as Ag or an Ag alloy.

The hole injection layer 220 and the first hole transporting layer 222 are disposed on the anode 210, in correspondence to all of the red, green, and blue pixel areas Rp, Gp, and Bp. The first hole transporting layer 222 is a common hole transporting layer, and the hole injection layer 220 may be omitted. The total thickness of the hole injection layer 220 and the first hole transporting layer 222 may be about 1250 Å, but may be adjusted in consideration of the characteristics of hole injection and hole transportation.

The second hole transporting layer 224 is positioned on the first hole transporting layer 222, in correspondence to the red and green pixel areas Rp and Gp.

That is, in the first embodiment shown in FIG. 3, the second and third hole transporting layers 124 and 126 having different thicknesses are respectively formed in the red and green pixel areas RP and Gp, whereas in the second embodiment, the second hole transporting layer 224 having a uniform thickness is formed in the red and green pixel areas Rp and Gp. Meanwhile, like the first embodiment, in the second embodiment, no separate hole transporting layer is formed in the blue pixel area Bp.

The electron blocking layer 230 is formed on the second hole transporting layer 224 of the red and green pixel areas Rp and Gp and the first hole transporting layer 222 of the blue pixel area Bp. The electron blocking layer 230 causes electrons emitted from the cathodes 260 to stay in the emitting material layer. However, the electron blocking layer 230 may be omitted.

The red organic light-emitting pattern 242 is disposed in the red pixel area Rp, the green organic light-emitting pattern 244 is disposed in the red and green pixel areas Rp and Gp, and the blue organic light-emitting pattern 246 is formed in all of the red, green, and blue pixel areas Rp, Gp, and Bp. The red organic light-emitting pattern 242 may be thicker than the green and blue organic light-emitting patterns 244 and 246. The red organic light-emitting pattern 242 has a thickness of about 450 Å, and each of the green and blue organic light-emitting patterns 244 and 246 has a thickness of about 200 Å. However, the thicknesses of the red, green, and blue emission patterns 242, 244, and 246 may be adjusted as long as the red organic light-emitting pattern 242 is thicker than the green and blue organic light-emitting patterns 244 and 246.

That is, in the red pixel area Rp, the red organic light-emitting pattern 242, the green organic light-emitting pattern 244, and the blue organic light-emitting pattern 246 are stacked to form a first emitting material pattern 247 with a three-layered structure, in the green pixel area Gp, the green organic light-emitting pattern 244 and the blue organic light-emitting pattern 246 are stacked to form a second emitting material pattern 248 with a two-layered structure, and in the blue pixel area Bp, the blue organic light-emitting pattern 246 forms a third emitting material pattern 249 with a signal layer. Accordingly, the second emitting material pattern 248 is thinner than the first emitting material pattern 247 and thicker than the third emitting material pattern 249.

The electron transporting layer 250 is formed on the blue organic light-emitting patterns 246 formed in the red, green, and blue pixel areas Rp, Gp, and Bp. The electron transporting layer 250 has a thickness of about 350 Å, however, the thickness of the electrode transporting layer 250 may be adjusted in consideration of the characteristics of electron transportation. The electron transporting layer 250 acts as a layer for electron transportation and injection, or an electron injection layer may be formed on the electron transporting layer 250.

The cathode 260 is disposed on the electron transporting layer 150. For example, the cathode 260 is formed of an alloy (Mg:Ag) of magnesium (Mg) and silver (Ag) to have a semi-transparent property. That is, light emitted from the emitting material layer is displayed to the outside through the cathode 260, and a part of the light returns to the anode 210 since the cathode 260 has the semi-transparent property.

As such, repeated reflection occurs between the anode 210 acting as a reflective layer and the cathode 260, which is called a microcavity effect. That is, since light is repeatedly reflected in the cavity between the anode 210 and the cathode 260, light efficiency increases.

At this time, since light emitted from the first, second, and third emitting material patterns 247, 248, and 249 formed respectively in the red, green, and blue pixel areas Rp, Gp, and Bp has different wavelengths, the thickness of a cavity defined as the distances between the anode 210 and the cathode 260 is differentiated. That is, in the red pixel area Rp from which red light having a longest wavelength is emitted, the anode 210 and the cathode 260 are spaced a first distance d1 apart, in the blue pixel area Bp from which blue light having a shortest wavelength is emitted, the anode 210 and the cathode 260 are spaced a third distance d3 apart, and in the green pixel area Gp from which green light is emitted, a second distance d2 between the anode 210 and the cathode 260 is shorter than the first distance d1 and longer than the third distance d3 (d1>d2>d3).

In order to obtain the difference in thickness, after the first hole transporting layer 222 is formed on the entire surface of the red, green, and blue pixel areas Rp, Gp, and Bp, the second hole transporting layer 224 is formed in the red and green pixel areas Rp and Gp. Also, in the red pixel area RP, the red organic light-emitting pattern 242, the green organic light-emitting pattern 244, and the blue organic light-emitting pattern 246 are stacked to form the first emitting material pattern 247 with the three-layered structure, in the green pixel area Gp, the green organic light-emitting pattern 244 and the blue organic light-emitting pattern 246 are stacked to form the second emitting material pattern 248 with the two-layered structure, and in the blue pixel area Bp, the blue organic light-emitting pattern 246 forms the third emitting material pattern 249 with the signal layer. Accordingly, the second emitting material pattern 248 is thinner than the first emitting material pattern 247 and thicker than the third emitting material pattern 249.

Meanwhile, the capping layer 270 is used to enhance a light extraction effect, and may be formed of one among materials for forming the first and second hole transporting layers 222 and 224, materials for forming the electron transporting layer 250, and host materials for forming the red, green, and blue organic light-emitting patterns 242, 244, and 246. However, the capping layer 270 may be omitted.

The organic light-emitting diode according to the second embodiment, as described above, requires no additional mask process although it has a microcavity structure.

Referring again to FIG. 4, after the anode 210 is formed, the hole injection layer 220 and the first hole transporting layer 222 are formed using a first fine metal mask. The hole injection layer 220 is formed by doping a material for forming the first hole transporting layer 222 with a p-type dopant, for example, boron, and the hole injection layer 220 and the first hole transporting layer 222 may be formed using the first fine metal mask in a first chamber.

Then, in a second chamber, the second hole transporting layer 224 is formed in the red and green pixel areas Rp and Gp using a second fine metal mask.

Successively, in a third chamber, the electron blocking layer 230 is formed using a third fine metal mask in the red, green, and blue pixel areas Rp, Gp, and Bp.

Then, in a fourth chamber, the red organic light-emitting pattern 242 is formed in the red pixel area Rp using a fourth fine metal mask, and in a fifth chamber, the green organic light-emitting pattern 244 is formed in the red and green pixel areas Rp and Gp using a fifth fine metal mask. Thereafter, in a sixth chamber, the blue organic light-emitting pattern 246 is formed in the red, green, and blue pixel areas Rp, Gp, and Bp using a sixth fine metal mask.

Thereafter, in seventh, eighth, and ninth chambers, the electron transporting layer 250, the cathode 260, and the capping layer 270 are sequentially formed.

That is, since processes are performed using 9 fine metal masks in a total of 9 chambers, a microcavity structure may be implemented without causing an increase of a fabrication cost and complexity of a fabrication method.

Since the second hole transporting layer 224 is formed in the red and green pixel areas Rp and Gp, the second embodiment may reduce the number of processes compared to the first embodiment in which both the second and third hole transporting layers 124 and 126 are formed. Meanwhile, by forming the first emitting material pattern 247 having the three-layered structure in the red pixel area Rp and the second emitting material pattern 248 having the two-layered structure in the green pixel area Gp although the third hole transporting layer 126 of the first embodiment is omitted, it is possible to maintain the differences in cavity thickness in the pixel areas Rp, Gp, and Bp.

The emission property of the emitting material pattern structure as described above depends on the order in which emitting material patterns are stacked.

Figure 5A:
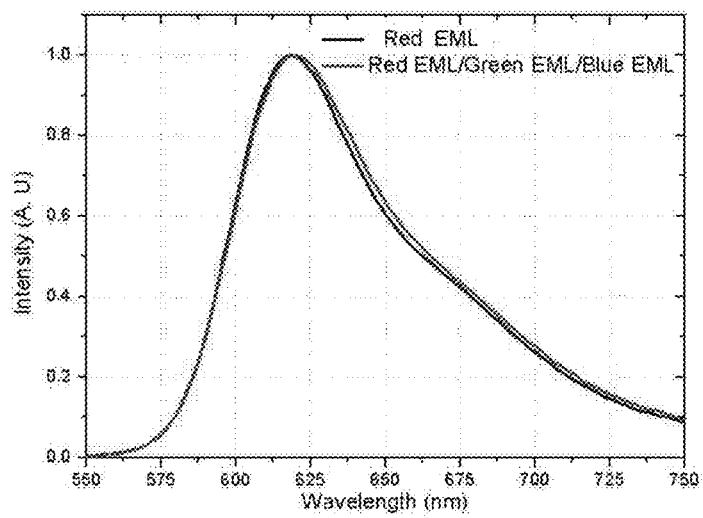
FIGS. 5A and 5B are graphs showing emission spectrums of red and green pixel areas in the organic light-emitting diodes according to the embodiments of the present invention.

Referring to FIG. 5A showing an emission spectrum when a green organic light-emitting pattern and a blue organic light-emitting pattern are sequentially stacked on a red organic light-emitting pattern (Red EML/Green EML/Blue EML), although the green and blue organic light-emitting patterns are stacked on a red organic light-emitting pattern, a red emission spectrum is displayed.

Figure 6A:
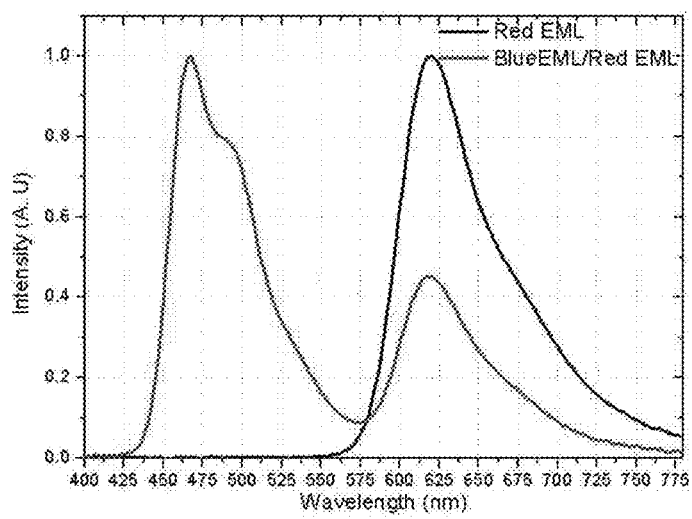
FIGS. 6A and 6B are graphs showing emission spectrums of organic light-emitting diodes in which different lamination structures are applied to red and green pixel areas.

However, referring to FIG. 6A showing an emission spectrum when a red organic light-emitting pattern is stacked on a blue organic light-emitting pattern (Blue EML/Red EML), both blue and red emission spectrums are displayed.

That is, in the second embodiment having the lamination structure of the red, green, and blue organic light-emitting patterns 242, 244, and 246, the color properties may be maintained, however, different structures deteriorate color properties.

Figure 5B:
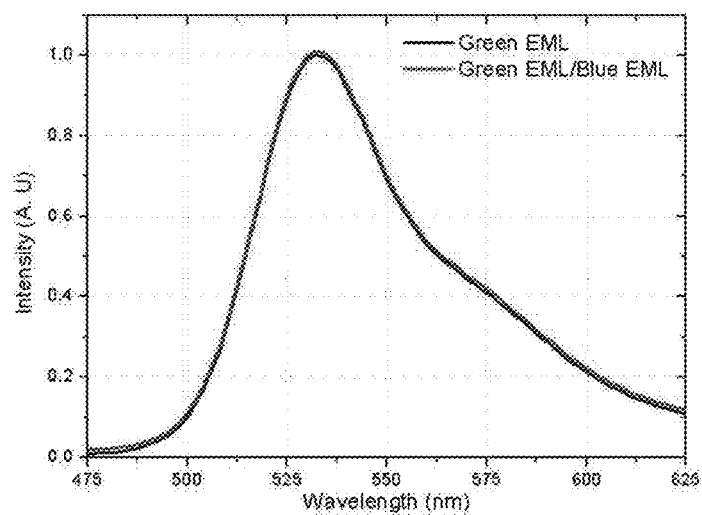

Also, referring to FIG. 5B showing an emission spectrum when a blue organic light-emitting pattern is stacked on a green organic light-emitting pattern (Green EML/Blue EML), although the blue organic light-emitting pattern is formed on the green organic light-emitting pattern, a green emission spectrum is displayed.

Figure 6B:
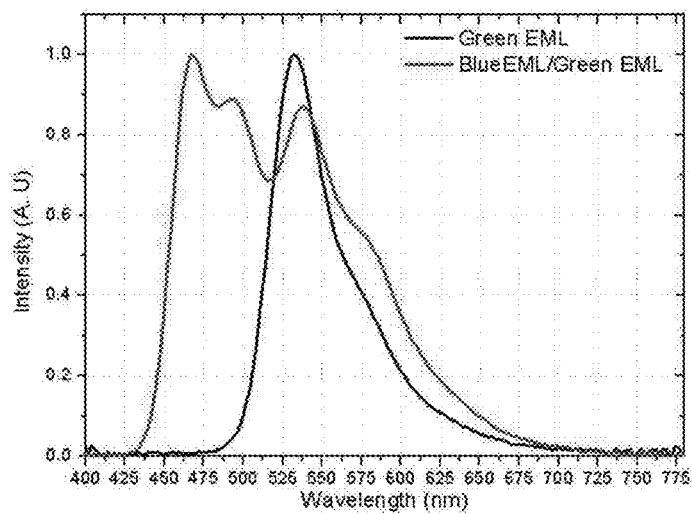

However, referring to FIG. 6B showing an emission spectrum when a green organic light-emitting pattern is stacked on a blue organic light-emitting pattern (Blue EML/Green EML), both blue and green emission spectrums are displayed.

That is, in the second embodiment having the lamination structure of the green and blue organic light-emitting patterns 244 and 246, the color properties may be maintained, however, different structures deteriorate color properties.

Emission in an organic light-emitting layer mainly occurs between the organic light-emitting layer and an electron blocking layer. If there is no electron blocking layer, emission will occur at the interface between the organic light-emitting layer and a hole transporting layer.

Accordingly, for example, in the case of the red pixel area Rp of the organic light-emitting diode shown in FIG. 4, emission mainly occurs at the interface between the red organic light-emitting pattern 242 and the electron blocking layer 230.

Also, the energy bandgap of the green organic light-emitting pattern 244 is greater than the energy bandgap of the red organic light-emitting pattern 242 and smaller than the energy bandgap of the blue organic light-emitting pattern 246. Electrons and holes that have been coupled and emitted light in an organic light-emitting pattern having an energy bandgap can again emit light in an organic light-emitting pattern having the narrower energy bandgap. However, electrons and holes that have been coupled and emitted light in an organic light-emitting pattern having an energy bandgap cannot emit light in an organic light-emitting pattern having the wider energy bandgap.

Accordingly, in a structure in which a blue organic light-emitting pattern and a green or red organic light-emitting pattern are sequentially stacked between an anode and a cathode, electrons and holes that have been coupled and emitted light in the blue organic light-emitting pattern can again emit light in the green or red organic light-emitting pattern. However, in a structure in which red, green, and blue organic light-emitting patterns are sequentially stacked between an anode and a cathode, electrons and holes that have been coupled and emitted light in the red organic light-emitting pattern do not emit light in the green and blue organic light-emitting patterns. Also, in a structure in which green and blue organic light-emitting patterns are sequentially stacked between an anode and a cathode, electrons and holes that have been coupled and emitted light in the green organic light-emitting pattern do not emit light in the blue organic light-emitting pattern having a wider energy bandgap.

Accordingly, in the structure as shown in FIG. 4 in which the red, green, and blue organic light-emitting patterns 242, 244, and 246 are stacked in the red pixel area Rp, as shown in FIG. 5A, only a red emission spectrum is displayed, while in the structure in which the blue and red organic light-emitting patterns are stacked, as shown in FIG. 6A, both blue and red emission spectrums are displayed.

Also, in the structure as shown in FIG. 4 in which the green and blue organic light-emitting patterns 244 and 246 are stacked on the green pixel area Gp, as shown in FIG. 5B, only a green emission spectrum is displayed, while in the structure in which the blue and green organic light-emitting patterns are stacked, as shown in FIG. 6B, both blue and green emission spectrums are displayed.

That is, only the lamination structure of red, green, and blue pixel areas Rp, Gp, and Bp, as shown in FIG. 4, can represent desired colors.

As described above, the organic light-emitting diode can improve light output efficiency using a microcavity structure.

Also, it is possible to implement the microcavity structure without increasing the number of processes and to prevent a fabrication cost from increasing and a fabrication method from being complicated.

In addition, it is possible to maintain color properties and display high-quality images even when different organic light-emitting patterns are stacked in red and green pixel areas for the microcavity structure.

It will be apparent to those skilled in the art that various modifications and variations can be made in a display device of the present disclosure without departing from the sprit or scope of the invention. Thus, it is intended that the present invention covers the modifications and variations of this invention provided they come within the scope of the appended claims and their equivalents.

What is claimed is:

1. An organic light-emitting diode comprising:
    a substrate on which a red pixel area, a green pixel area, and a blue pixel area are defined;
    an anode disposed on the substrate and corresponding to the red pixel area, the green pixel area, and the blue pixel area;
    a first hole transporting layer disposed on the anode and corresponding to the red pixel area, the green pixel area, and the blue pixel area;
    a second hole transporting layer disposed on the first hole transporting layer and corresponding to the red pixel area and the green pixel area, the second hole transporting layer having a uniform thickness;
    a first emitting material pattern disposed on the second hole transporting layer and corresponding to the red pixel area, the first emitting material pattern having a first thickness;
    a second emitting material pattern disposed on the second hole transporting layer and corresponding to the green pixel area, the second emitting material pattern having a second thickness;
    a third emitting material pattern disposed on the first hole transporting layer and corresponding to the blue pixel area, the third emitting material pattern having a third thickness;
    an electron transporting layer disposed on the first emitting material pattern, the second emitting material pattern, and the third emitting material pattern and corresponding to the red pixel area, the green pixel area, and the blue pixel area; and
    a cathode disposed on the electron transporting layer and corresponding to the red pixel area, the green pixel area, and the blue pixel area,
    wherein the second thickness is less than the first thickness and greater than the third thickness, and
    wherein an electron blocking layer is formed between the second hole transporting layer and each of the first and second emitting material patterns, and between the third emitting material pattern and the first hole transporting layer.

2. The organic light-emitting diode according to claim 1, wherein the anode is a reflective electrode, the cathode has a semi-transparent property and is spaced first, second, and third distances apart from the anode in the red pixel area, the green pixel area, and the blue pixel area, respectively, and the second distance is shorter than the first distance and longer than the third distance.

3. The organic light-emitting diode according to claim 1, wherein a hole injection layer is interposed between the first hole transporting layer and the anode, and the electron injection layer is formed by doping a material for forming the first hole transporting layer with a p-type dopant.

4. The organic light-emitting diode according to claim 1, wherein the second hole transporting layer maintains the uniform thickness in the area corresponding to where the electron blocking layer is formed.

5. The organic light-emitting diode according to claim 1, wherein the first and second emitting material patterns are formed on a same plane of the electron blocking layer.

6. The organic light-emitting diode according to claim 1, wherein the electron blocking layer is formed directly on the first and second hole transporting layers.

7. The organic light-emitting diode according to claim 1, wherein the first emitting material pattern has a three-layered structure in which a red organic light-emitting pattern, a green organic light-emitting pattern, and a blue organic light-emitting pattern are stacked on the second hole transporting layer.

8. The organic light-emitting diode according to claim 7, wherein the second emitting material pattern has a two-layered structure in which the green organic light-emitting pattern and the blue organic light-emitting pattern are stacked on the second hole transporting layer.

9. The organic light-emitting diode according to claim 8, wherein the third emitting material pattern has a single layer structure consisting of the blue organic light-emitting pattern.

10. An organic light-emitting diode comprising:
    a substrate on which a red pixel area, a green pixel area, and a blue pixel area are defined;
    an anode disposed on the substrate and corresponding to the red pixel area, the green pixel area, and the blue pixel area;
    a first hole transporting layer disposed on the anode and corresponding to the red pixel area, the green pixel area, and the blue pixel area;
    a second hole transporting layer disposed on the first hole transporting layer and corresponding to the red pixel area and the green pixel area, the second hole transporting layer having a uniform thickness;
    a first emitting material pattern disposed on the second hole transporting layer and corresponding to the red pixel area, the first emitting material pattern having a first thickness;
    a second emitting material pattern disposed on the second hole transporting layer and corresponding to the green pixel area, the second emitting material pattern having a second thickness;
    a third emitting material pattern disposed on the first hole transporting layer and corresponding to the blue pixel area, the third emitting material pattern having a third thickness;
    an electron transporting layer disposed on the first emitting material pattern, the second emitting material pattern, and the third emitting material pattern and corresponding to the red pixel area, the green pixel area, and the blue pixel area; and a cathode disposed on the electron transporting layer and corresponding to the red pixel area, the green pixel area, and the blue pixel area, wherein the second thickness is less than the first thickness and greater than the third thickness, and a distance between the first emitting material pattern and the substrate is the same as a distance between the second emitting material pattern and the substrate, wherein an electron blocking layer is formed between the second hole transporting layer and each of the first and second emitting material patterns, and between the third emitting material pattern and the first hole transporting layer.

* * * * *